(12) United States Patent
Ishida et al.

(10) Patent No.: US 7,596,173 B2
(45) Date of Patent: Sep. 29, 2009

(54) TEST APPARATUS, CLOCK GENERATOR AND ELECTRONIC DEVICE

(75) Inventors: Masahiro Ishida, Tokyo (JP); Takahiro Yamaguchi, Tokyo (JP); Mani Soma, Seattle, WA (US)

(73) Assignee: Advantest Corporation, Tokyo (JP)

( * ) Notice: Subject to any disclaimer, the term of this patent is extended or adjusted under 35 U.S.C. 154(b) by 649 days.

(21) Appl. No.: 11/260,665

(22) Filed: Oct. 28, 2005

(65) Prior Publication Data

US 2007/0098128 A1    May 3, 2007

(51) Int. Cl.
    *H04B 3/46*    (2006.01)
(52) U.S. Cl. .................. 375/226; 375/376; 375/371; 714/700; 714/724; 702/69
(58) Field of Classification Search .............. 375/226, 375/376, 371, 306; 714/700, 724; 702/69
    See application file for complete search history.

(56) References Cited

U.S. PATENT DOCUMENTS

| 6,442,225 | B1* | 8/2002 | Huang ................. 375/376 |
|---|---|---|---|
| 7,315,574 | B2* | 1/2008 | Hafed et al. ............... 375/226 |
| 2003/0179842 | A1* | 9/2003 | Kane et al. ................. 375/376 |
| 2003/0188235 | A1* | 10/2003 | Kozaki ....................... 714/700 |
| 2004/0193975 | A1* | 9/2004 | Tarango et al. ............. 714/724 |
| 2004/0223559 | A1* | 11/2004 | Hill ........................... 375/306 |
| 2006/0083341 | A1* | 4/2006 | Naffziger et al. ........... 375/371 |
| 2006/0100801 | A1* | 5/2006 | Tabatabaei et al. ........... 702/69 |
| 2007/0041255 | A1* | 2/2007 | Jeddeloh .................... 365/201 |

FOREIGN PATENT DOCUMENTS

| JP | 6112785 | 4/1994 |
|---|---|---|
| JP | 2000-341100 | 12/2000 |

OTHER PUBLICATIONS

Sangeeta Raman et al, "A Precise Clock Phase Multiplier", Aug. 2005, pp. 2639-2642.
PCT Search Report dated Mar. 7, 2006.

* cited by examiner

*Primary Examiner*—Sudhanshu C Pathak
(74) *Attorney, Agent, or Firm*—Sterne, Kessler, Goldstein & Fox P.L.L.C.

(57) ABSTRACT

There is provided a clock generator for generating a single-phase clock into which jitter has been injected, having a multi-phase clock generating section for generating a plurality of clock signals having an almost equal phase difference from each other and a jitter injecting section for injecting jitter into the respective clock signals.

16 Claims, 10 Drawing Sheets

TEST APPARATUS, CLOCK GENERATOR AND ELECTRONIC DEVICE

BACKGROUND OF THE INVENTION

1. Field of the Invention

The present invention relates to a clock generator for generating a clock into which jitter has been injected, a test apparatus for testing a device-under-test and an electronic device for outputting the clock into which jitter has been injected.

2. Related Art

Conventionally, a multi-phase clock is being used in high-speed data communication devices or serial I/O devices for the purpose of generating precisely timed bit intervals.

The multi-phase clock is generated by aligning phases of a plurality of low-frequency clocks so as to be evenly spaced from each other. For example, as the plurality of low-frequency clocks, signals outputted out of respective delay elements in a DLL (delay-locked loop) circuit or signals outputted out of respective inverters in a PLL (phase-locked loop) circuit are used.

There is also a jitter test among testing items for testing high-speed communication devices and the like. According to the recommendation of the International Telecommunication Union (ITU), the test must be carried out by injecting jitter having frequency of several 100 MHz into communication data for example.

However, a conventional multi-phase clock generator generates such multi-phase clock by aligning phases of low-frequency clocks so as to be evenly spaced by using the DLL, PLL or the like. Therefore, such multi-phase clock has had no jitter and could not be used for the jitter test. Still more, it has been difficult to inject high-frequency jitter into the high-frequency multi-phase clock after generating such high-frequency clock and hence it has been difficult to use the conventional multi-phase clock for the jitter test.

Accordingly, it is an object of the invention to provide a test apparatus and a clock generator capable of solving the above-mentioned problems. This object may be achieved through the combination of features described in independent claims of the invention. Dependent claims thereof specify preferable embodiments of the invention.

SUMMARY OF THE INVENTION

In order to solve the above-mentioned problem, according to a first aspect of the invention, there is provided a clock generator for generating a single-phase clock into which jitter has been injected, having a multi-phase clock generating section for generating a plurality of clock signals having an almost equal phase difference from each other and a jitter injecting section for injecting jitter into the respective clock signals.

The multi-phase clock generating section may have a plurality of delay elements for sequentially delaying a given reference clock by a predetermined time each, a phase detector for detecting a phase difference between an output signal outputted out of the plurality of delay elements and the reference clock and a delay control section for controlling the delay time of the respective delay elements based on the phase difference detected by the phase detector so as to output the signals outputted out of the respective delay elements as respective clock signals.

The multi-phase clock generating section may have a ring oscillator in which a plurality of inverters is connected in a loop, a phase detector for detecting a phase difference between a signal outputted out of the ring oscillator and the given reference clock and a delay controller for controlling a delay time of each inverter based on the phase difference detected by the phase detector so as to output the signals outputted out of the respective inverters as respective clock signals.

The jitter injecting section may have a plurality of variable delay circuits provided corresponding to the plurality of clock signals to delay and output the corresponding clock signals and a jitter control section for controlling a value of delay of the respective variable delay circuits based on data of jitter to be injected into the single-phase clock.

The jitter control section may control the value of delay of the respective variable delay circuits independently from each other.

The jitter control section may have a plurality of jitter memories provided corresponding to the plurality of variable delay circuits to store individual jitter data for controlling the value of delay of the corresponding variable delay circuit.

After when the corresponding variable delay circuit outputs a pulse, the respective jitter memories may be accessed to their contents as jitter data in order to set the subsequent value of delay time to the corresponding variable delay circuit.

The jitter control section may further have a data generating section for generating individual jitter data to be stored in the respective jitter memories based on the jitter data to be injected into the single-phase clock.

The jitter control section may have a jitter memory for storing the jitter data to be injected into the single-phase clock and a demultiplexer for outputting each bit of the jitter data sequentially outputted out of the jitter memory as control data of the corresponding variable delay circuit.

The jitter control section may further have a counter for counting a number of pulses in a given counter clock to sequentially specify an address of the jitter memory every time when a counted value reaches a predetermined value and a period control section for controlling a period of jitter to be injected into the single-phase clock by setting the predetermined value to the counter.

The jitter control section may further have a counter for counting a number of pulses in a given counter clock to sequentially specify an address of the jitter memory every time when a counted value reaches a predetermined value and a period control section for generating a pseudo random binary sequence to supply to the counter as the counter clock.

The jitter control section may further have a frequency control section for controlling frequency of occurrences of a predetermined logical value in the pseudo random binary sequence generated by the period control section.

In order to generate the single-phase clock, the clock generator may further have a clock converter for combining the clock signals into which jitter has been injected in the jitter injecting section.

According to a second aspect of the invention, there is provided a test apparatus for testing a device-under-test, having a clock generating section for generating a single-phase clock into which jitter has been injected, a pattern generating section for generating test data to be inputted to the device-under-test in synchronism with the single-phase clock and a judging section for evaluating the device-under-test based on a signal outputted out of the device-under-test, wherein the clock generating section has a multi-phase clock generating section for generating a plurality of clock signals each having a pulse at almost equal intervals and a jitter injecting section for injecting jitter into each of the clock signals.

The clock generating section may further have a clock converter for combining the clock signals into which jitter has been injected in the jitter injecting section to generate a single-phase clock.

According to a third aspect of the invention, there is provided an electronic device for generating a single-phase clock into which jitter has been injected, having a multi-phase clock generating section for generating a plurality of clock signals each having almost equal phase difference, a jitter injecting section for injecting jitter into each of the clock signals and a chip substrate on which the multi-phase clock generating section and the jitter injecting section are provided.

In order to generate the single-phase clock, the electronic device may further have a clock converter provided on the chip substrate to combine the clock signals into which jitter has been injected.

It is noted that the summary of the invention described above does not necessarily describe all necessary features of the invention. The invention may also be a sub-combination of the features described above.

DETAILED DESCRIPTION OF THE INVENTION

The invention will now be described based on preferred embodiments, which do not intend to limit the scope of the invention, but exemplify the invention. All of the features and the combinations thereof described in the embodiments are not necessarily essential to the invention.

Figure 1:
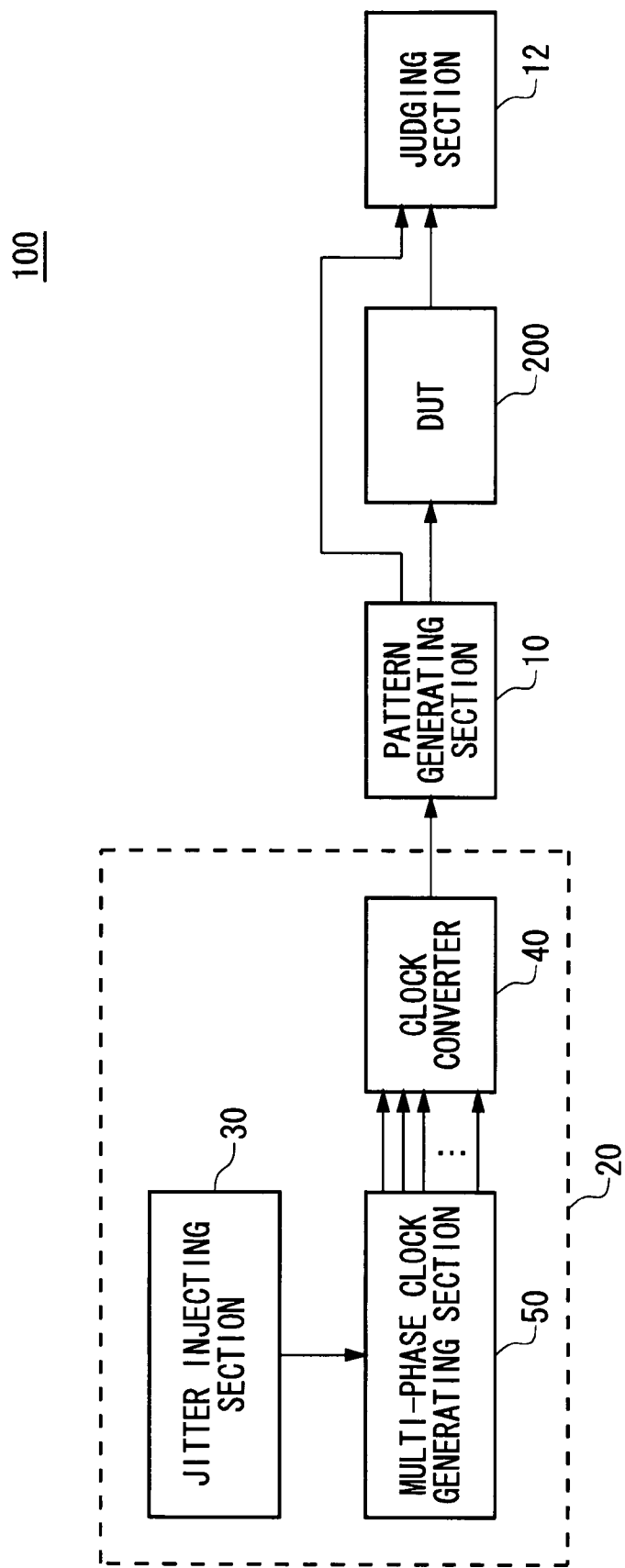
FIG. 1 is a diagram showing one exemplary configuration of a test apparatus 100 according an embodiment of the invention.

FIG. 1 is a diagram showing one exemplary configuration of a test apparatus 100 according to an embodiment of the invention. The test apparatus 100 is an apparatus for testing a device-under-test (DUT) 200 such as a communication device and has a clock generating section 20, a pattern generating section 10 and a judging section 12.

The clock generating section 20 generates an output clock into which jitter has been injected. The operation of the clock generating section 20 used to output a high-frequency single-phase clock as the output clock will be explained in this example. In another example, the clock generating section 20 may output a multi-phase clock as the output clock without having a clock converter 40.

It is preferable for the clock generating section 20 to be able to inject desirable jitter into the single-phase clock. The pattern generating section 10 generates test data (test pattern) to be inputted to the DUT 200 in synchronism with the single-phase clock given from the clock generating section 20. The pattern generating section 10 also generates expected value data that is supposed to be outputted out of the DUT 200 based on the test data.

The judging section 12 compares the signal outputted out of the DUT 200 corresponding to the test data with the expected value data given from the pattern generating section 10 to evaluate the DUT 200. For example, it measures jitter tolerance of the DUT 200 by injecting jitter into the single-phase clock under control of the clock generating section 20 and judging the applied jitter amplitude across which the DUT 200 start to introduce error bits in output signal.

The clock generating section 20 has the multi-phase clock generating section 50, a jitter injecting section 30 and the clock converter 40.

The multi-phase clock generating section 50 generates a plurality of clock signals each having pulses at equal intervals in a predetermined cycle period. The multi-phase clock generating section 50 generates the plurality of clock signals whose phases are aligned so as to be evenly spaced from each other in a predetermined cycle period by using a DLL circuit or a PLL circuit.

The jitter injecting section 30 injects jitter into each of the clock signals generated by the multi-phase clock generating section 50. For example, the jitter injecting section 30 has means for independently delaying each clock signal and injects jitter into each clock signal by controlling a value of delay given to each clock signal.

The clock converter 40 combines the respective clock signals into which jitter has been injected to generate the single-phase clock. That is, the clock generating section 20 injects jitter into the low-frequency clock signals and combines the clock signals into which the jitter has been injected. Such configuration allows the generation of the high-frequency single-phase clock into which the jitter has been injected to be generated readily. It also allows the high-frequency jitter component to be readily injected because the high-frequency jitter component to be injected into the single-phase clock is injected into each edge of the low-frequency clock signals.

Still more, the test apparatus 100 of the present embodiment can readily carry out the test of the DUT 200 using the high-frequency jitter.

The clock generating section 20 may be one electronic device. In this case, the electronic device has the jitter injecting section 30, the multi-phase clock generating section 50, the clock converter 40 and one chip substrate on which such configuration is provided. The chip substrate may be a semiconductor substrate.

A reference clock described later in connection with FIG. 2 may be given to the electronic device externally. For example, the reference clock may be given to the electronic device from the test apparatus 100 in which such electronic device is provided.

Figure 2:
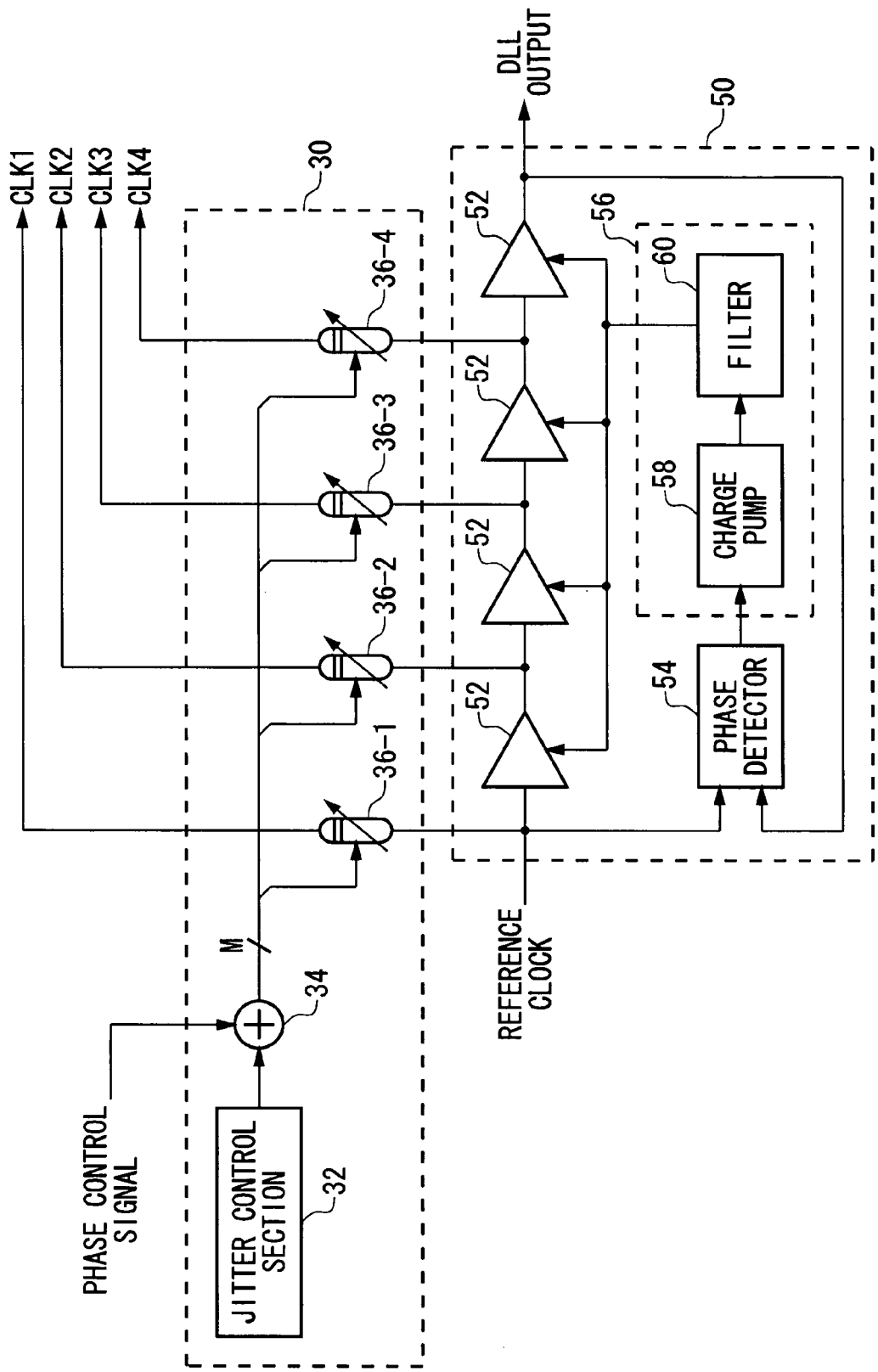
FIG. 2 is a diagram showing one exemplary configuration of a multi-phase clock generating section and a jitter injecting section 50.

FIG. 2 is a diagram showing one exemplary configuration of the multi-phase clock generating section 50 and the jitter injecting section 30. In this example, the multi-phase clock generating section 50 has a configuration using the DLL circuit and has a plurality of cascaded delay elements 52, a phase detector 54 and a delay control section 56.

Each of the delay elements 52 produces delay time corresponding to given control voltage. Still more, the reference clock inputted to the first delay element 52 delays by predetermined delay time corresponding to the control voltage, as it passes through the respective delay elements 52.

The phase detector 54 detects a phase difference between a signal outputted out of the final delay element 52 and the reference clock. The delay control section 56 outputs the control voltage for controlling the delay time of each delay element 52 based on the phase difference detected by the phase detector 54. In this example, the delay control section 56 has a charge pump 58 and a filter 60.

The charge pump 58 outputs a current pulse signal corresponding to the phase difference detected by the phase detector 54 and feeds it to the filter 60. The filter 60 converts the given current pulse signal into the control voltage.

The multi-phase clock generating section 50 also outputs the signals outputted out of the respective delay elements 52 as the respective clock signals (CLK1 through CLK4). Although the multi-phase clock generating section 50 of this example has the four delay elements 52 and outputs the four clock signals, the number of the delay elements 52 and of clock signals is not limited to be four. The multi-phase clock generating section 50 may have a desirable number of delay elements 52 corresponding to frequency of a multi-phase clock to be generated and frequency of jitter which can be injected into the respective clock signals.

The jitter injecting section 30 has a plurality of variable delay circuits (36-1 through 36-4: generically denoted as 36 hereinbelow), a jitter control section 32 and an adder 34. The plurality of variable delay circuits 36 is provided corresponding to the plurality of clock signals and delays and feeds the corresponding clock signal to the clock converter 40. That is, the plurality of variable delay circuits 36 is provided corresponding to the plurality of delay elements 52. Each variable delay circuit 36 delays the signal inputted to or outputted out of the corresponding delay element 52 and feeds it to the clock converter 40.

The jitter control section 32 controls the delay time of the respective variable delay circuits 36 based on jitter data to be injected into the single-phase clock. Preferably, the jitter control section 32 controls the delay time of the respective variable delay circuits 36 independently from each other. It becomes possible to inject jitter into the respective clock signals by controlling the delay time of the respective variable delay circuits 36 corresponding to the jitter data indicating jitter component to be injected.

The jitter injecting section 30 of this example allows the control of the delay time of the respective variable delay circuits 36 is achieved by adjusting the delaying the edges of the constituent low-frequency clock signals. Therefore, the high-frequency single-phase clock into which high-frequency jitter has been injected may be readily generated by injecting low-frequency jitter into the low-frequency clock signal using each variable delay circuit 36 and by combining the respective clock signals.

The adder 34 controls the value of delay in each variable delay circuit 36 based on a signal obtained by adding the delay control signal outputted out of the jitter control section 32 with a phase control signal set in advance. Here, the phase control signal is a signal for adjusting initial phase of a clock signal when no jitter is injected into the clock signal. The phase control signal allows the phases of each clock signal to be controlled at high precision so that they are evenly spaced.

Figure 3:
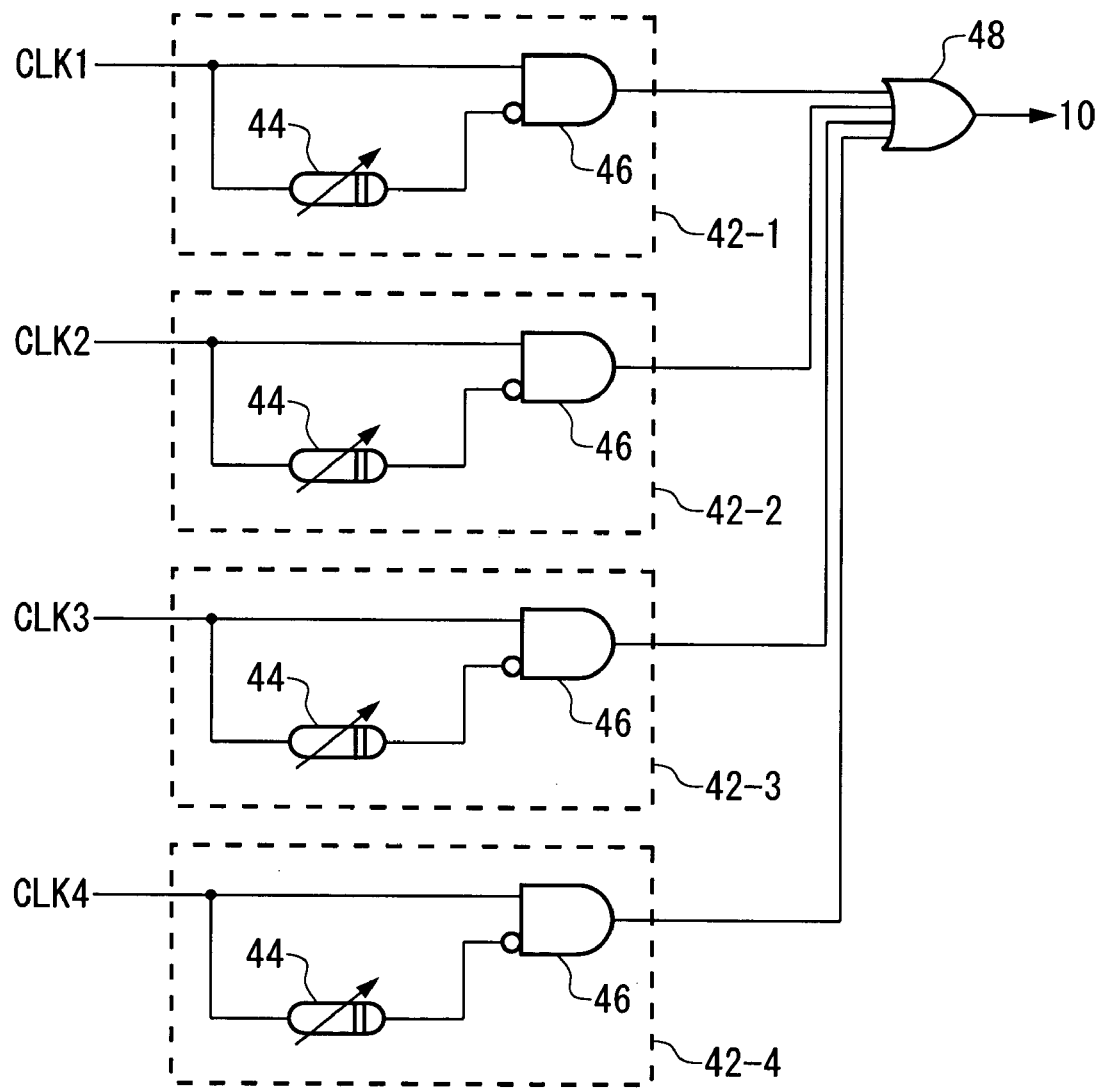
FIG. 3 is a diagram showing one exemplary configuration of a clock converter 40.

FIG. 3 is a diagram showing one exemplary configuration of the clock converter 40. The clock converter 40 of this example has a plurality of pulsers (42-1 through 42-4: generically denoted as 42 hereinbelow) and an OR circuit 48. The plurality of pulsers 42 is provided corresponding to the plurality of clock signals (CLK1 through CLK4). Each pulser 42 outputs a pulse signal of a predetermined pulse width corresponding to rising edges of the corresponding clock signal.

In this example, each pulser 42 has a delay circuit 44 that specifies the pulse width of the pulse signal and an AND circuit 46. The delay circuit 44 delays and outputs the corresponding clock signal. The AND circuit 46 outputs AND of the corresponding clock signal and a signal obtained by inverting the signal outputted out of the delay circuit 44. Such configuration allows a pulse signal having a pulse width corresponding to the delay time of the delay circuit 44 to be generated by adjusting the rising edges of the clock signal.

The OR circuit 48 outputs OR of the pulse signals outputted out of the respective pulsers 42. Thereby, the respective clock signals may be combined and the high-frequency single-phase clock into which jitter has been injected may be generated.

Figure 4:
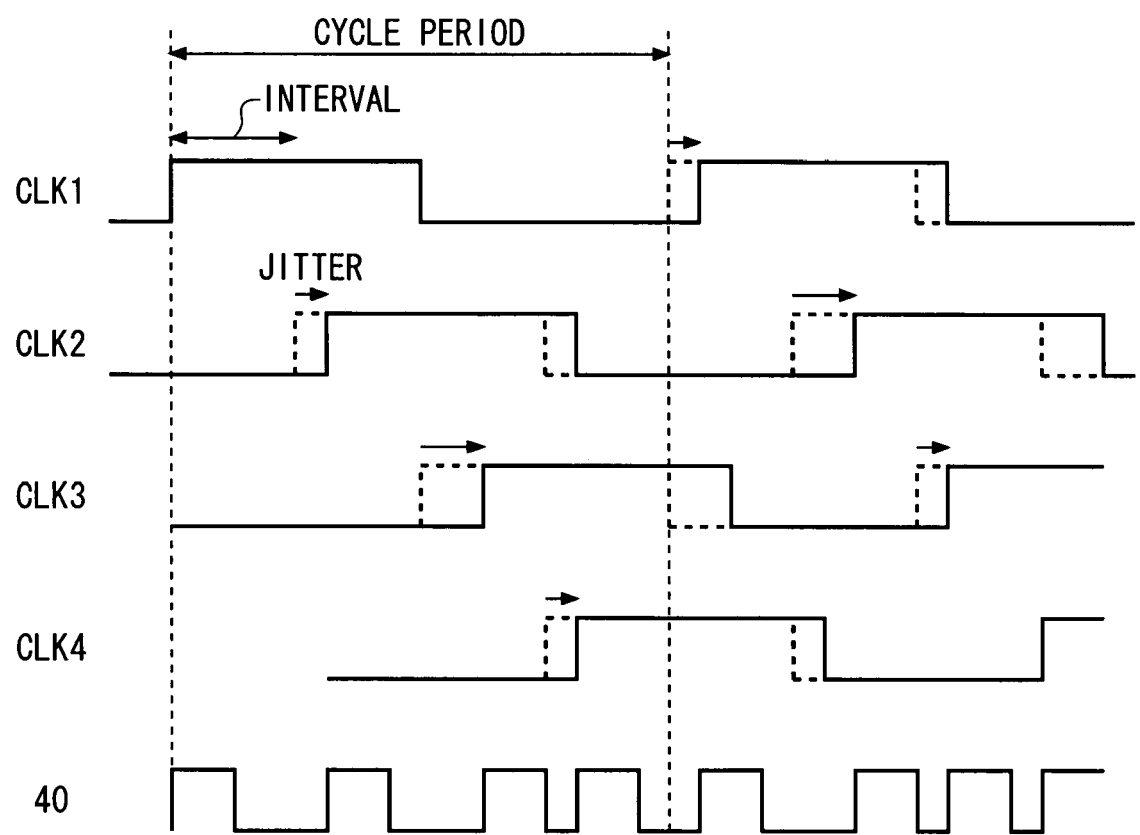
FIG. 4 is a timing chart showing one example of respective clock signals and a single-phase clock generated by the clock generating section 20 shown in FIGS. 2 and 3.

FIG. 4 is a timing chart showing one example of the respective clock signals (CLK1 through CLK4) and the single-phase clock generated by the clock generating section 20 shown in FIGS. 2 and 3. The multi-phase clock generating section 50 generates the plurality of clock signals evenly spaced in a predetermined cycle period as described above. In FIG. 4, dotted lines indicate waveforms of the clock signals outputted out of the multi-phase clock generating section 50.

Then, the jitter injecting section 30 independently injects jitter into the respective clock signals. In FIG. 4, solid lines indicate waveforms of the respective clock signals into which jitter has been injected. The jitter injecting section 30 controls the delay time of the corresponding variable delay circuit 36 in order to delay edges of each low-frequency clock signal. That is, the jitter injecting section 30 replaces the high-frequency jitter to be injected into the single-phase clock with the low-frequency jitters, which are injected into constituent low-frequency clock signals and interleaved with each other. Therefore, the jitter injecting section 30 can readily inject the high-frequency jitter.

Then, the clock converter 40 combines the respective clock signals into which jitter has been injected. Because the clock converter 40 generates the predetermined pulse signal corresponding to the rising edges of each clock signal into which jitter has been injected, the jitter component injected into the corresponding clock signal is kept in each pulse signal. Therefore, jitter obtained by combining the jitter components injected into the respective clock signals is regarded being injected into the single-phase clock obtained by combining the respective pulse signals. Therefore, the high-frequency jitter may be readily injected into the single-phase clock.

Figure 5:
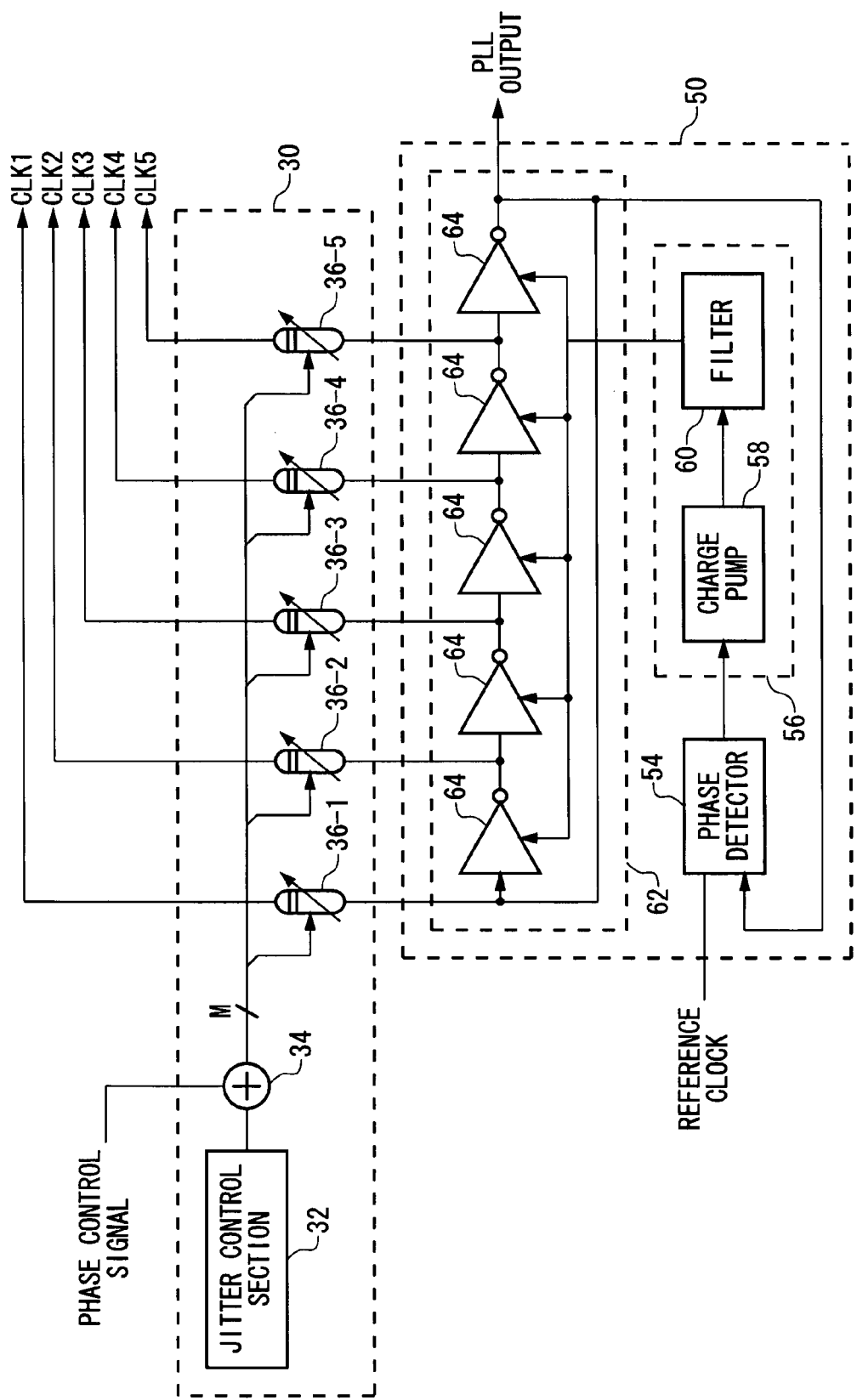
FIG. 5 is a diagram showing another exemplary configuration of the multi-phase clock generating section 50.

FIG. 5 is a diagram showing another exemplary configuration of the multi-phase clock generating section 50. The multi-phase clock generating section 50 of this example has a configuration using the PLL circuit and has a plurality of inverters 64 connected in a loop, the phase detector 54 and the delay control section 56.

The multi-phase clock generating section 50 has the inverters 64. These circuits may be differential circuits. Each inverter 64 delays an input signal by the delay time corresponding to the given control voltage and outputs by inverting it.

The phase detector 54 detects a phase difference between the signal outputted out of any one of the inverters 64 and the predetermined reference clock. Based on the phase difference detected by the phase detector 54, the delay control section 56 outputs the control voltage for controlling the delay time in each inverter 64. The delay control section 56 of this example has the charge pump 58 and the filter 60.

The charge pump 58 outputs a current pulse signal corresponding to the phase difference detected by the phase detector 54 and feeds it to the filter 60. The filter 60 converts the given current pulse signal into the control voltage.

The multi-phase clock generating section 50 also outputs the signals outputted out of the respective inverters 64 as respective clock signals (CLK1 through CLK5). Although the multi-phase clock generating section 50 has the five inverters 64 and outputs the five clock signals in this example, the number of the inverters 64 and of the clock signals is not limited to be five. The multi-phase clock generating section 50 may have a desirable number of inverters 64 corresponding to frequency of the multi-phase clock to be generated and frequency of jitter which can be injected into the respective clock signals.

The jitter injecting section 30 shown in FIG. 5 has the same function and configuration with the jitter injecting section 30 explained in connected with FIG. 2, so that its explanation will be omitted here.

The multi-phase clock into which high-frequency jitter has been injected may be readily generated and the single-phase clock into which high-frequency jitter has been injected may be readily generated by using the multi-phase clock generating section 50 having such configuration.

Figure 6:
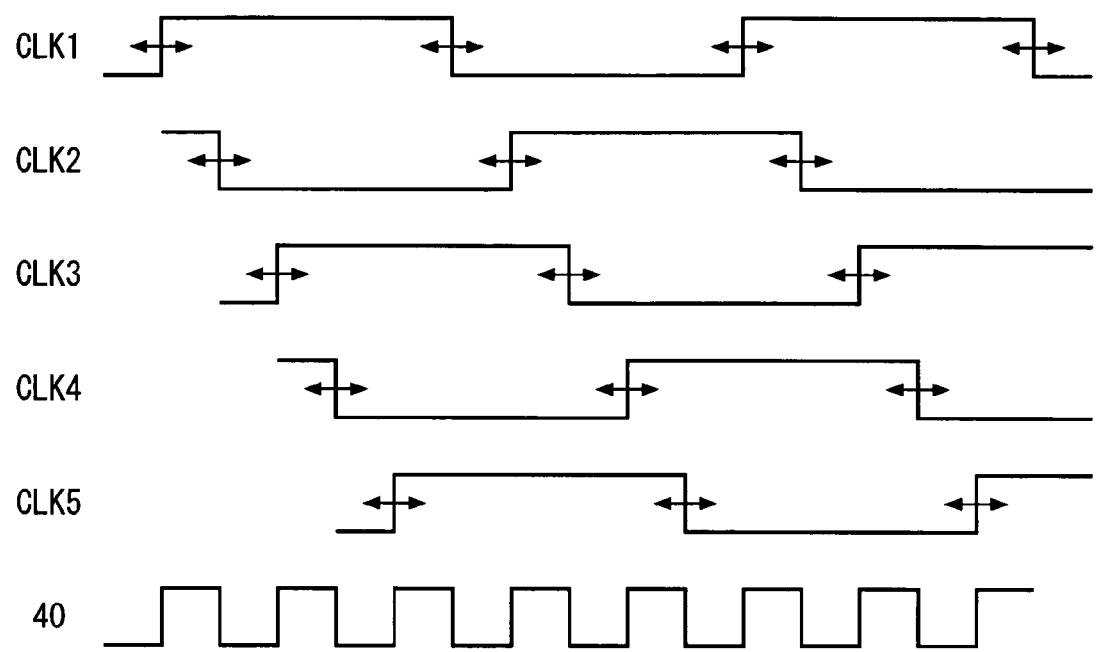
FIG. 6 is a timing chart showing one example of the respective clock signals outputted out of the multi-phase clock generating section 50 shown in FIG. 5.

FIG. 6 is a timing chart showing one example of the respective clock signals outputted out of the multi-phase clock generating section 50 shown in FIG. 5. The respective clock signals outputted out of the respective inverters 64 have pulses almost evenly spaced in a predetermined cycle period as shown in FIG. 6. Then, jitter is injected into the respective clock signals by the jitter injecting section 30 as indicated by arrows in FIG. 6.

The clock converter 40 combines the respective clock signals into which jitter has been injected to generate the high-frequency single-phase clock into which high-frequency jitter has been injected.

Figure 7:
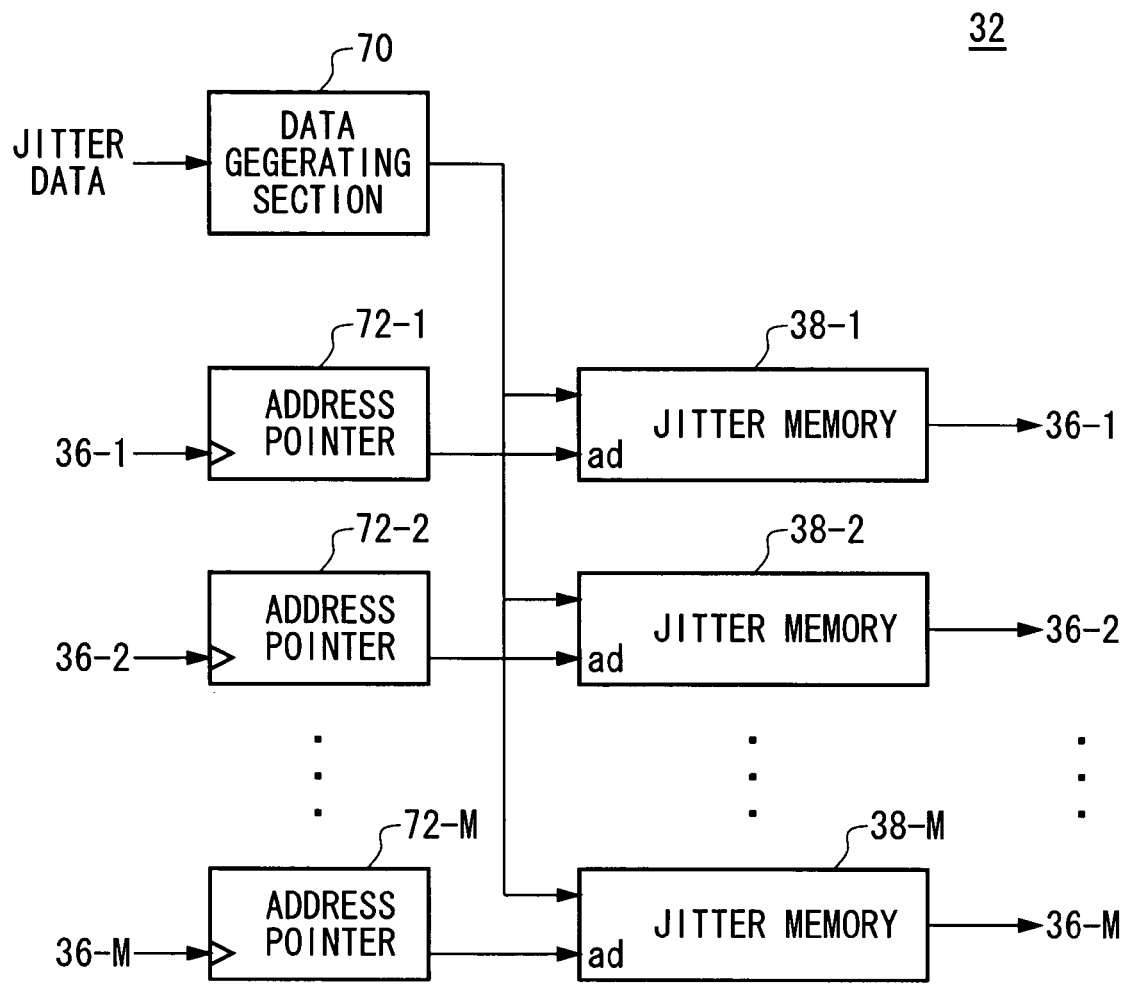
FIG. 7 is a diagram showing one exemplary configuration of a jitter control section 32.

FIG. 7 is a diagram showing one configuration of the jitter control section 32. The jitter control section 32 of this example has a plurality of jitter memories (38-1 through 38-M: generically denoted as 38 hereinbelow), a plurality of address pointers (72-1 through 72-M: generically denoted as 72 hereinbelow) and a data generating section 70.

The plurality of jitter memories 38 is provided corresponding to the plurality of variable delay circuits 36. Each jitter memory 38 stores individual jitter data for controlling the delay time of the corresponding variable delay circuit 36. The jitter injecting section 30 controls the delay time of the corresponding variable delay circuit 36 and injects jitter into the corresponding clock signal based on the individual jitter data stored in each jitter memory 38.

The individual jitter data stored in each jitter memory 38 may be data obtained by re-sampling the jitter data to be injected into the single-phase clock. For example, the individual jitter data corresponds to data of the waveform of jitter to be injected into the single-phase clock sampled by each clock signal. The data generating section 70 may produce the respective individual jitter data and store in the respective jitter memories 38 based on the jitter data to be injected into the single-phase clock.

The jitter control section 32 may also have the plurality of address pointers 72. The plurality of address pointers 72 is provided corresponding to the plurality of jitter memories 38. Just after the corresponding variable delay circuit 36 outputting the pulse, the respective address pointers 72 sequentially designate an address of the corresponding jitter memory 38. Thereby, after when the corresponding variable delay circuit 36 outputs the pulse, the jitter memory 38 outputs jitter data to be set subsequently. That is, timing jitter corresponding to jitter waveform to be injected may be injected into each pulse contained in each clock signal.

Figure 8:
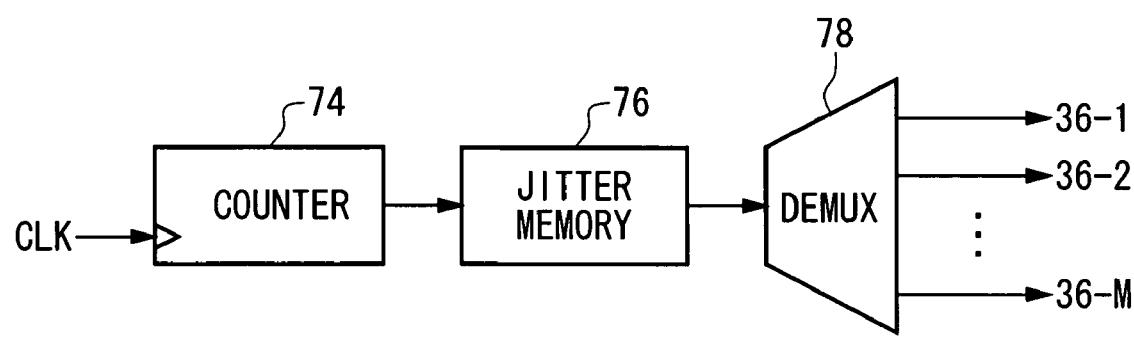
FIG. 8 is a diagram showing another exemplary configuration of the jitter control section 32.

FIG. 8 is a diagram showing another exemplary configuration of the jitter control section 32. The jitter control section 32 of this example has a counter 74, a jitter memory 76 and a demultiplexer 78.

The jitter memory 76 stores jitter data to be injected into the single-phase clock. The jitter memory 76 may store jitter data corresponding to sine wave jitter or jitter data corresponding to random jitter for example. Still more, the jitter data may be jitter data corresponding to rectangular jitter or jitter data corresponding to jitter having other waveform. The jitter data stored in the jitter memory 76 may be predetermined jitter data or contents of jitter data may be changed dynamically during its injection.

The counter 74 sequentially designates addresses of the jitter memories 76 with each counter clock. The demultiplexer 78 outputs respective bits of the jitter data sequentially outputted out of the jitter memory 76 as control data of the corresponding variable delay circuit 36.

In this example, the jitter memory 76 stores the control data of the plurality of variable delay circuits 36 in its respective addresses. Then, the demultiplexer 78 receives the control data for the plurality of variable delay circuits 36 and feeds the respective control data to the corresponding variable delay circuits 36.

The counter 74 counts a number of pulses with the applied counter clock and sequentially designates the address of the jitter memory 76 every time when the counted value reaches a predetermined value. The counter 74 may receive the counter clock having almost equal frequency with the single-phase clock. The counter 74 may also receive the single-phase clock as the counter clock.

Figure 9:
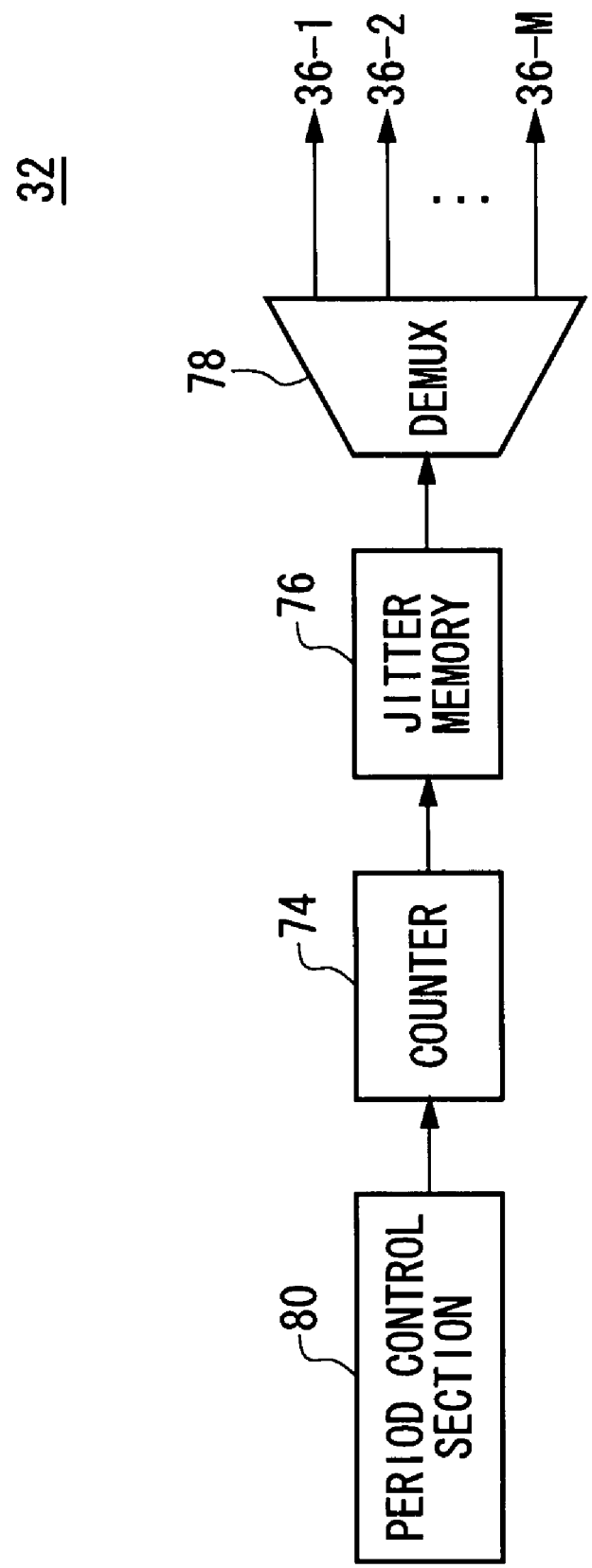
FIG. 9 is a diagram showing a still other exemplary configuration of the jitter control section 32.

FIG. 9 is a diagram showing a still other exemplary configuration of the jitter control section 32. The jitter control section 32 of this example has a period control section 80 in addition to the configuration of the jitter control section 32 explained in connection with FIG. 8.

The period control section 80 controls whether or not the address designated for the jitter memory 76 is to be reset to the initial address when the counted value reaches a certain value in the counter 74. It allows period of the jitter to be injected into the single-phase clock to be controlled. For instance, the period of jitter injected into the single-phase clock is doubled when the address outputted to the jitter memory 76 is reset when the counted value reaches 2X as compared to a case when the address is reset when the counted value reaches X.

The period control section 80 may change the initial binary number set in the counter 74 at random. Such control allows the jitter whose period is controlled at random to be injected into the single-phase clock. The period control section 80 may generate a pseudo random binary sequence and feed it to the counter 74 as an initial binary number.

In this case, the jitter control section 32 may control frequency when a predetermined logic value occurs in the pseudo random binary sequence generated by the period control section 80. For example, it may control the frequency when logic value 1 occurs in the pseudo random binary sequence.

Figure 10:
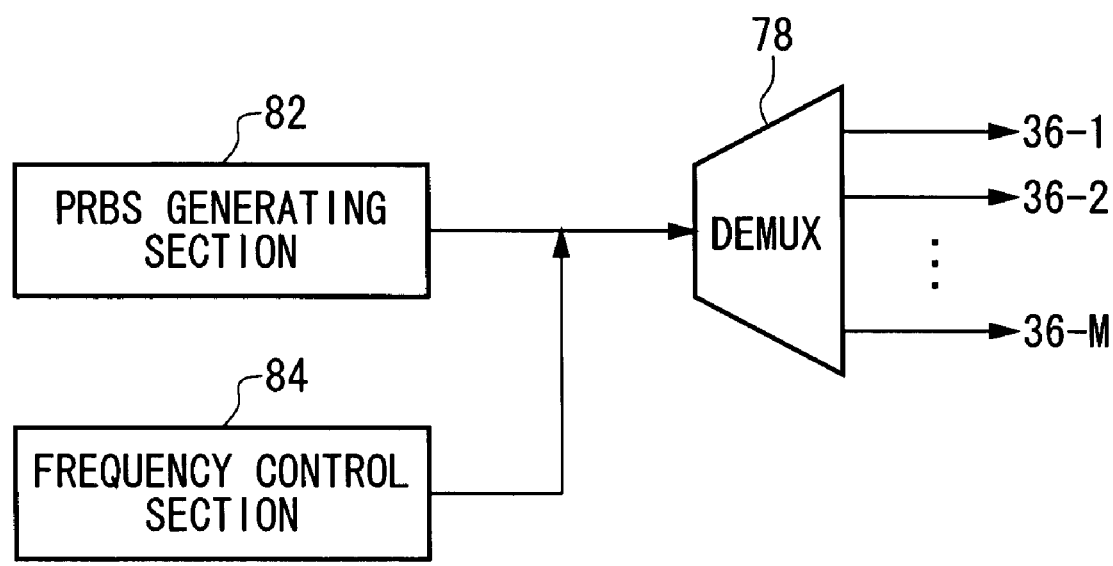
FIG. 10 is a diagram showing a still other exemplary configuration of the jitter control section 32.

FIG. 10 is a diagram showing a still other exemplary configuration of the jitter control section 32. The jitter control section 32 of this example has a pseudo random binary sequence (PRBS) generating section 82, a frequency of the occurrences control section 84 and a demultiplexer 78. The PRBS generating section 82 generates a pseudo random binary sequence of n bits for example.

The frequency of the occurrences control section 84 controls the frequency when the predetermined logic value occurs in the pseudo random binary sequence generated by the PRBS generating section 82.

The demultiplexer 78 receives the pseudo random binary sequence generated by the PRBS generating section 82 and feeds each data sequence in the pseudo random binary sequence to the corresponding variable delay circuit 36 as delay control data.

Such configuration allows the single-phase clock to which random jitter has been injected to be generated.

As it is apparent from the above description, the invention allows the high-frequency clock into which high-frequency jitter has been injected to be readily generated. Still more, the use of this clock allows the device-under-test to be tested accurately.

Although the invention has been described by way of the exemplary embodiments, it should be understood that those skilled in the art might make many changes and substitutions without departing from the spirit and scope of the invention. It is obvious from the definition of the appended claims that the embodiments with such modifications also belong to the scope of the invention.

What is claimed is:

1. A clock generator for generating a single-phase clock into which jitter has been injected, comprising:
   a multi-phase clock generating section for generating a plurality of clock signals having an almost equal phase difference from each other; and
   a jitter injecting section for injecting jitter into said respective clock signals based on jitter data representing jitter to be injected into an output of said clock generator, said jitter injecting section comprising:
      a plurality of jitter injecting circuits corresponding to respective clock signals, each of the jitter injecting circuits injecting jitter into its corresponding clock signal and outputting the corresponding clock signal into which jitter has been injected; and
      a jitter control section that controls jitter in each of the jitter injecting circuits based on individual jitter data representing jitter to be injected into the corresponding clock signal,
   wherein said plurality of jitter injecting circuits comprises a plurality of variable delay circuits provided corresponding to the plurality of clock signals to delay and output the corresponding clock signals, and
   wherein said jitter control section is constructed and arranged to control the delay time of said respective variable delay circuits based on said jitter data of jitter to be injected into said output clock.

2. The clock generator as set forth in claim 1, wherein said multi-phase clock generating section comprises:
   a plurality of delay elements for sequentially delaying a given reference clock by a predetermined time each;
   a phase detector for detecting a phase difference between an output signal from the plurality of delay elements and the reference clock; and
   a delay control section for controlling the delay time of respective delay elements based on said phase difference detected by said phase detector so that said multi-phase clock generating section outputs the signals output from said respective delay elements as said respective clock signals.

3. The clock generator as set forth in claim 1, wherein said multi-phase clock generating section comprises:
   a ring oscillator in which a plurality of inverters are connected in a loop;
   a phase detector for detecting a phase difference between a signal outputted out of said ring oscillator and the given reference clock; and
   a delay controller for controlling a delay time of each of said inverters based on said phase difference detected by said phase detector so that said multi-phase clock generating section outputs from respective inverters as said respective clock signals.

4. The clock generator as set forth in claim 1, wherein said jitter control section controls the delay times of said respective variable delay circuits independently of each other.

5. The clock generator as set forth in claim 4, wherein said jitter control section comprises a plurality of jitter memories, corresponding to said plurality of variable delay circuits, constructed and arranged to store said individual jitter data for controlling the delay time of said corresponding variable delay circuit.

6. The clock generator as set forth in claim 5, wherein said respective jitter memories are constructed and arranged to output said individual jitter data to be set after the corresponding variable delay circuit outputs a pulse.

7. The clock generator as set forth in claim 5, wherein said jitter control section further comprises a data generating section for generating said individual jitter data to be stored in said respective jitter memories based on said jitter data of jitter to be injected into said output clock.

8. The clock generator as set forth in claim 4, wherein said jitter control section comprises:
   a jitter memory for storing said jitter data representing jitter to be injected into said output clock; and
   a demultiplexer for outputting respective bits of said jitter data sequentially from said jitter memory as control data of said corresponding variable delay circuit.

9. The clock generator as set forth in claim 8, wherein said jitter control section further comprises:
   a counter for counting a number of pulses in a given counter clock to sequentially specify an address of the jitter memory every time a counted value reaches a predetermined value; and
   a period control section for controlling a period of jitter to be injected into said output clock by setting said predetermined value.

10. The clock generator as set forth in claim 8, wherein said jitter control section further comprises:
    a counter for counting a number of pulses in a given counter clock to sequentially specify an address of the jitter memory every time a counted value reaches a predetermined value; and
    a period control section for generating a pseudo random binary sequence to supply to said counter as said counter clock.

11. The clock generator as set forth in claim 10, wherein said jitter control section further comprises a frequency of the occurrences control section for controlling frequency of occurrences of a predetermined logical value in said pseudo random binary sequence generated by said period control section.

12. The clock generator as set forth in claim 1, further comprising a clock converter for combining said clock signals into which jitter has been injected to generate the single-phase clock.

13. A test apparatus for testing a device-under-test, comprising:
    a clock generating section for generating an output clock into which jitter has been injected;

a pattern generating section for generating test data to be inputted to said device-under-test in synchronism with said output clock; and a judging section for evaluating said device-under-test based on a signal outputted out of said device-under-test, wherein said clock generating section comprises:

a multi-phase clock generating section for generating a plurality of clock signals each having pulses at almost equal intervals; and a jitter injecting section for injecting jitter into each of the clock signals based on jitter data of jitter to be injected into said output clock, said jitter injecting section comprising:

a plurality of jitter injecting circuits corresponding to respective clock signals, each of the jitter injecting circuits injecting jitter into its corresponding clock signal and outputting the corresponding clock signal into which jitter has been injected; and a jitter control section that controls jitter in each of the jitter injecting circuits based on individual jitter data of jitter to be injected into the corresponding clock signal, wherein said plurality of jitter injecting circuits comprises a plurality of variable delay circuits provided corresponding to the plurality of clock signals to delay and output the corresponding clock signals, and wherein said jitter control section is constructed and arranged to control the delay time of said respective variable delay circuits based on said jitter data of jitter to be injected into said output clock.

14. The test apparatus as set forth in claim 13, wherein said clock generating section further comprises a clock converter for combining said clock signals into which jitter has been injected to generate a single-phase clock.

15. An electronic device for generating a clock into which jitter has been injected, comprising:

a multi-phase clock generating section for generating a plurality of clock signals each having almost equal phase difference;

a jitter injecting section for injecting jitter into each of said clock signals based on jitter data representing jitter to be injected into said output clock, said jitter injecting section comprising:

a plurality of jitter injecting circuits corresponding to respective clock signals, each of the jitter injecting circuits injecting jitter into its corresponding clock signal and outputting the corresponding clock signal into which jitter has been injected; and a jitter control section that controls jitter in each of the jitter injecting circuits based on individual jitter data representing jitter to be injected into the corresponding clock signal; and a chip substrate on which said multi-phase clock generating section and said jitter injecting section are provided, wherein said plurality of jitter injecting circuits comprises a plurality of variable delay circuits provided corresponding to the plurality of clock signals to delay and output the corresponding clock signals, and wherein said jitter control section is constructed and arranged to control the delay time of said respective variable delay circuits based on said jitter data of jitter to he injected into said output clock.

16. The electronic device as set forth in claim 15, further comprising a clock converter provided on said chip substrate to combine said clock signals into which said jitter has been injected to generate the single-phase clock.

* * * * *